United States Patent [19]
Chou

[11] Patent Number: 5,875,544
[45] Date of Patent: Mar. 2, 1999

[54] MULTIFUNCTIONAL IC HAND TOOL

[76] Inventor: Shu Chun Yu Chou, 24, Alley 96, Lane 158, Cheng Kong Road, Ho Lee Hsiang Taichung Hsien, Taiwan

[21] Appl. No.: 933,047

[22] Filed: Sep. 18, 1997

[51] Int. Cl.⁶ .............................. B23P 19/00; H05K 3/30
[52] U.S. Cl. .................................. 29/741; 29/758; 29/764
[58] Field of Search ............................ 29/750, 751, 758, 29/764, 740, 741; 7/107

[56] References Cited

U.S. PATENT DOCUMENTS

| | | | |
|---|---|---|---|
| 3,628,244 | 12/1971 | Halstead | 29/626 |
| 4,172,317 | 10/1979 | Kober et al. | 29/566 |
| 4,800,654 | 1/1989 | Guyer | 29/741 |
| 4,984,355 | 1/1991 | Lubrano et al. | 29/741 |
| 5,058,264 | 10/1991 | Quach | 29/741 |
| 5,479,669 | 1/1996 | Chen | 7/107 |

*Primary Examiner*—Peter Vo
*Assistant Examiner*—Bobby Rushing, Jr.
*Attorney, Agent, or Firm*—Bacon & Thomas, PLLC

[57] ABSTRACT

An IC hand tool is composed of a base, a main body, a press rod, and two holding arms. The base is provided with a receiving space for locating an IC element. The main body is fastened at one end thereof with the base and provided with an axial through hole in which the press rod is located such that a cap of the press rod is located outside the top end of the main body and that a leg block of the press rod is located in the receiving space of the base. The main body is further provided with two protruded portions and a plurality of fastening lugs for fastening the holding arms pivotally. The holding arms are provided respectively at the bottom end thereof with a hooked body for holding securely the IC element which is located in the receiving space of the base. The IC element is handled by mainpulating the press rod with hand of an operator.

2 Claims, 8 Drawing Sheets

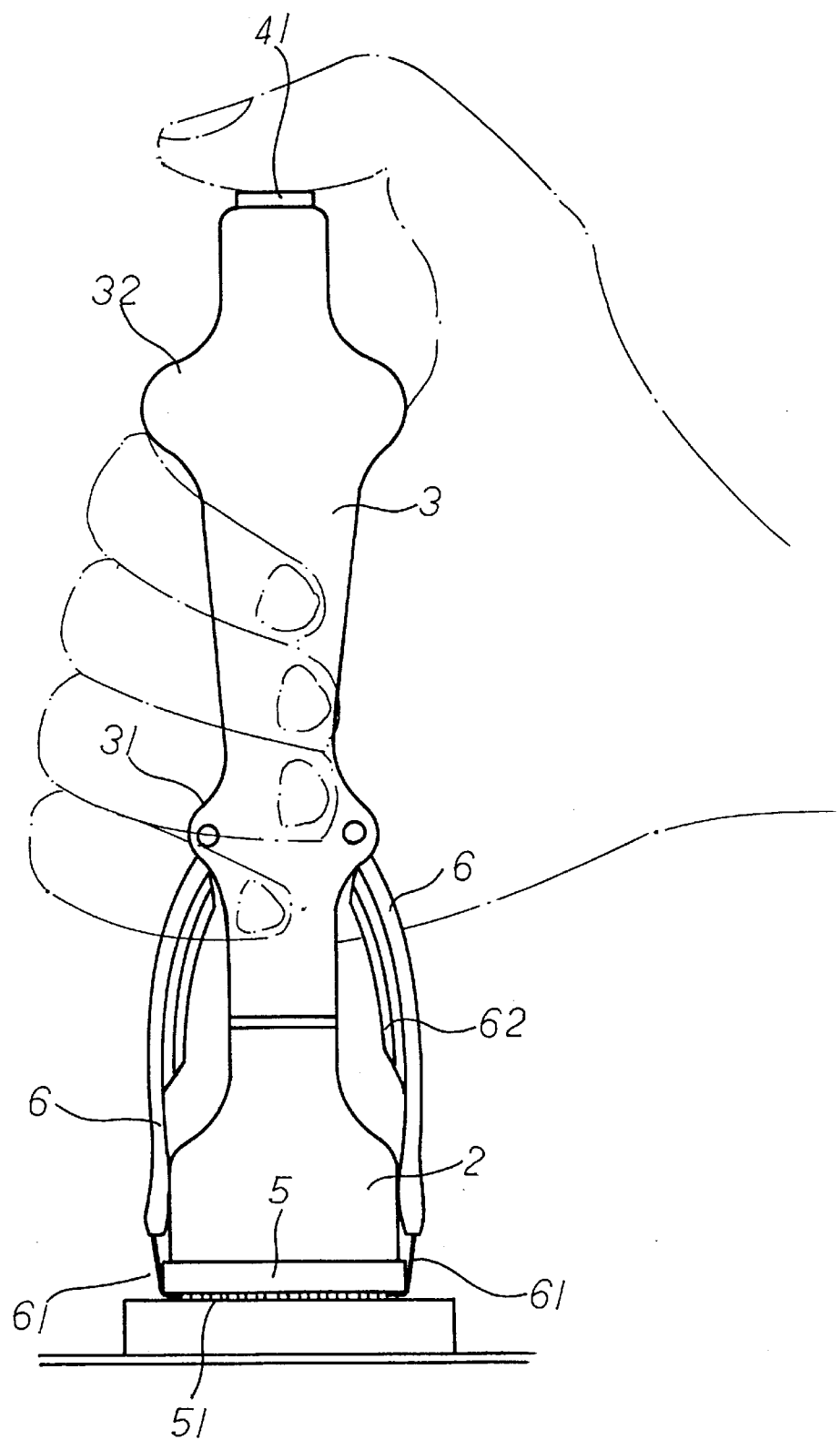
FIG. 4-A

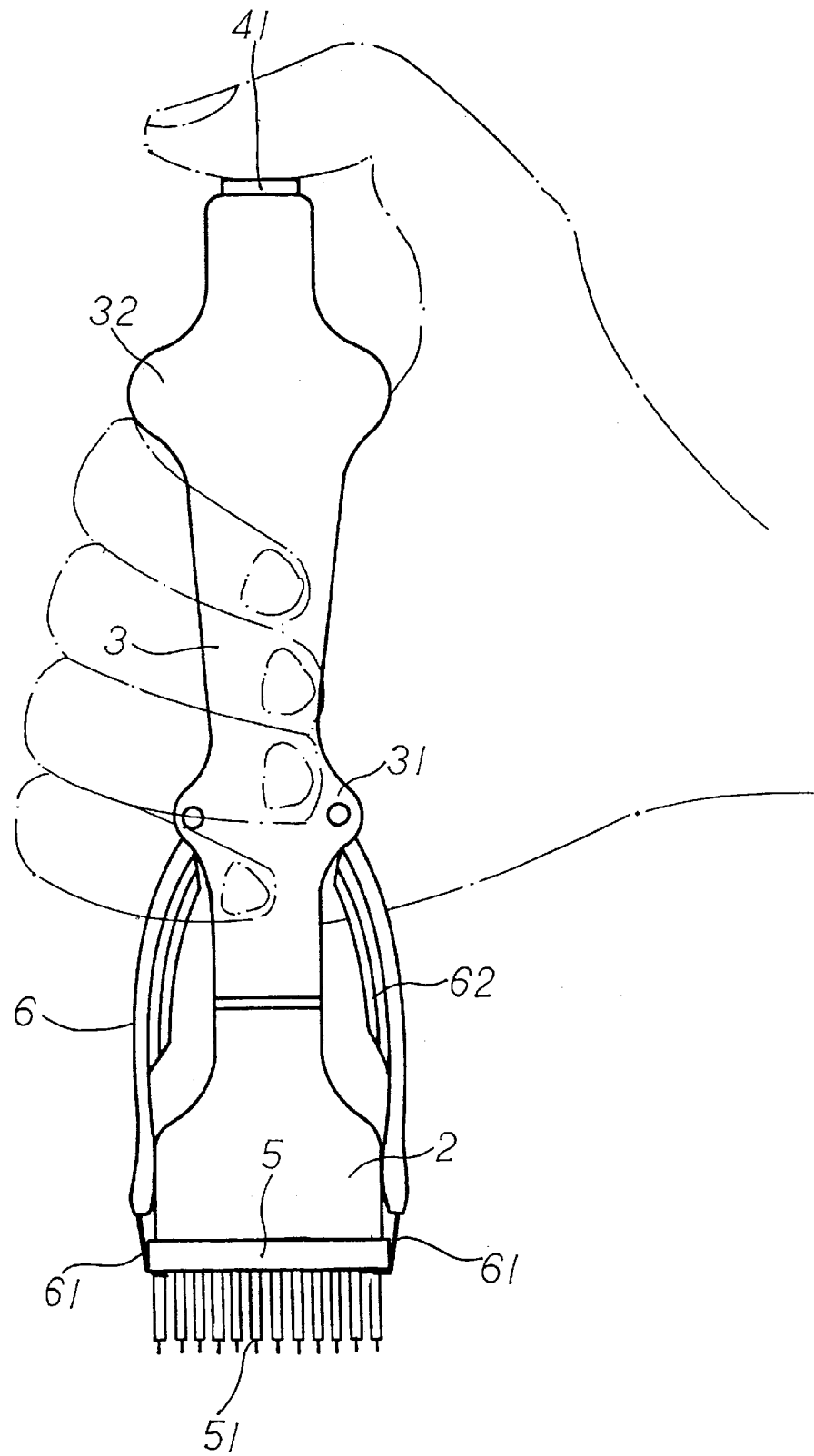
FIG 4-B

MULTIFUNCTIONAL IC HAND TOOL

FIELD OF THE INVENTION

The present invention relates generally to a hand tool for handling the electronic element, and more particularly to an IC hand tool.

BACKGROUND OF THE INVENTION

The conventional method for assembling and disassembling the IC elements calls for the use of two different tools, such as the guiding tool and the grasping tool. The use of such conventional hand tools as described above often results in a substantial increase in the cost of assembling and disassembling the IC elements. In addition, the use of such conventional hand tools can seriously undermine the production efficiency as well as the product quality. As illustrated in FIG. 7, a hand tool 1 of the prior art is composed of two holding arms 11 each having a hooked body 111 which is attached to the free end of the holding arm 11. As the holding arms 11 are exerted on by an external pressure, the hooked bodies 111 are force to move towards each other to hold an IC element. The prior art tool 1 described above is defective in design in that it has a very limited holding power, and that it can not hold the IC element securely.

SUMMARY OF THE INVENTION

The primary objective of the present invention is to provide an IC hand tool free from the shortcomings of the prior art hand tools.

In keeping with the principle of the present invention, the foregoing objective of the present invention is attained by an IC hand tool consisting of a base, a main body, a press rod, and two holding arms. The main body has a bottom end, which is fastened with the base. The press rod is provided with a spring fitted thereover and is located in the interior of the main body such that the top end of the press rod is fastened with a press portion. The press rod is provided at the bottom end thereof with a leg block having a toothed surface. The main body is provided in the outer wall of the upper segment thereof with two protruded portions opposite to each other, and in the outer wall of the lower segment thereof with two sets of lugs opposite to each other for fastening pivotally the holding arms. An IC element is held securely by the leg block of the press rod.

The foregoing objective, features and functions of the present invention will be more readily understood upon a thoughtful deliberation of the following detailed description of an embodiment of the present invention with reference to the accompanying drawings.

BRIEF DESCRIPTION OF THE DRAWINGS

FIG. 4-A shows a schematic view of the present invention holding an IC element.

FIG. 4-B shows a schematic view of the present invention pulling out an IC element.

DETAILED DESCRIPTION OF THE EMBODIMENT

Figure 1:
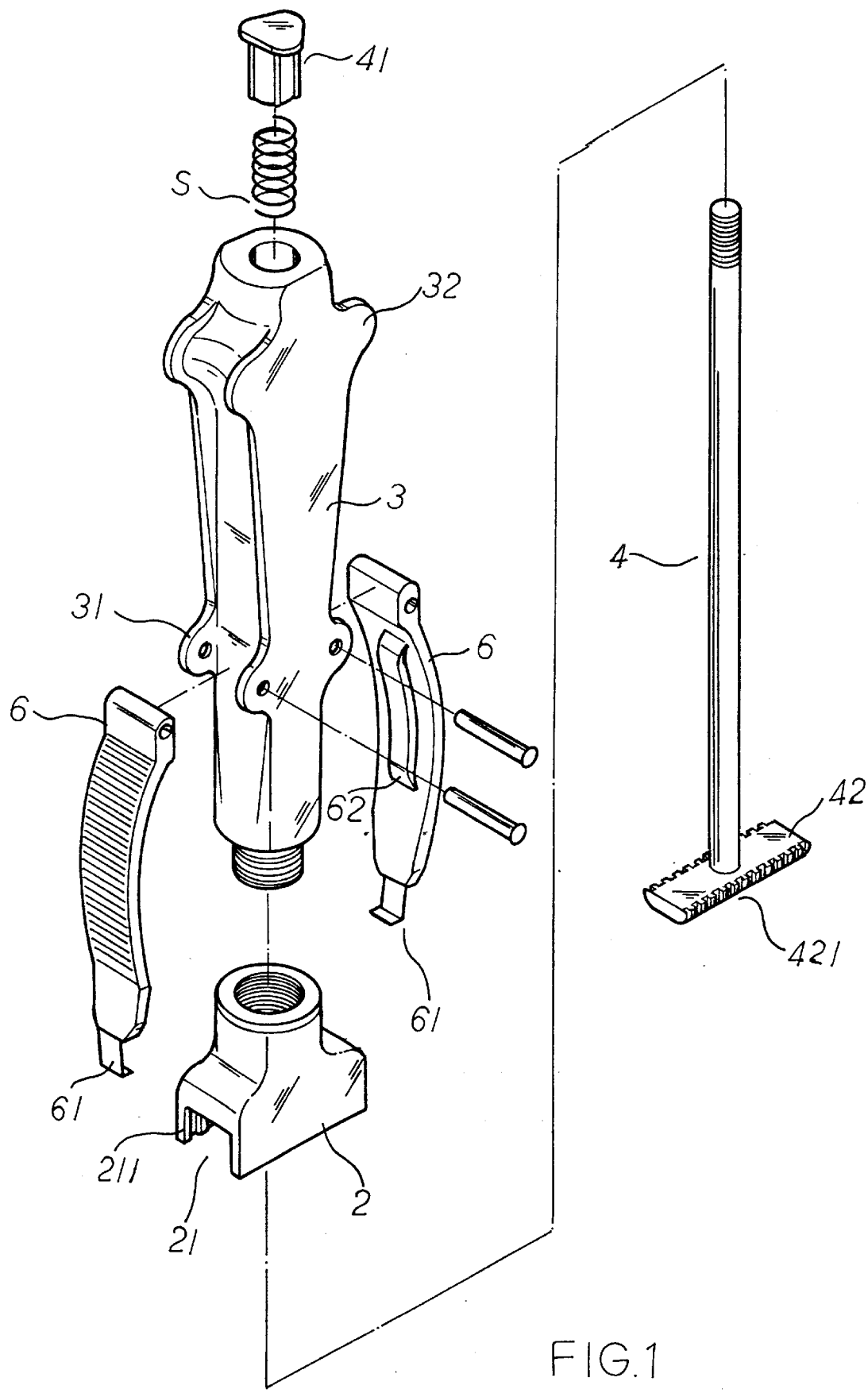
FIG. 1 shows an exploded view of the present invention.
Figure 2:
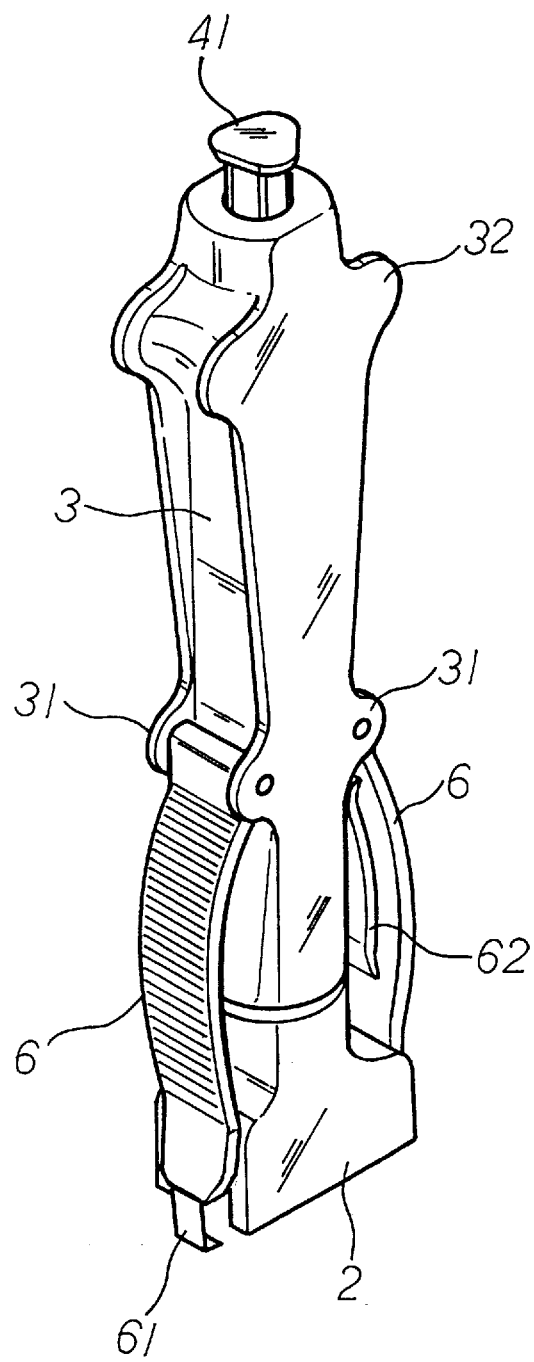
FIG. 2 shows a perspective view of the present invention in combination.
Figure 3:
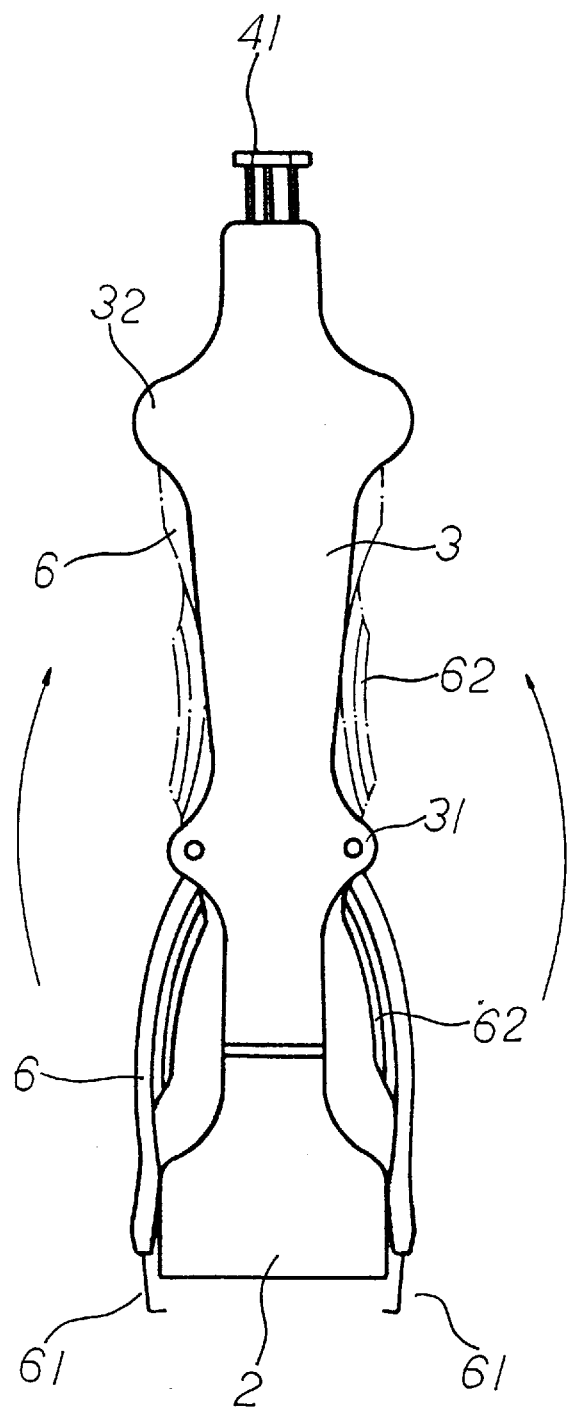
FIG. 3 shows a schematic view of the present invention at work.

As shown in FIGS. 1–3, an IC hand tool embodied in the present invention is composed of a base 2, a main body 3, a press rod 4, and two holding arms 6. The IC hand tool of the embodiment of the present invention is intended to handle an IC element 5.

The base 2 is provided at the bottom thereof with a receiving space 21 having a toothed portion 211, and at the top end thereof with a female threaded portion.

The main body 3 is provided portion at the bottom end thereof with a male threaded portion which is engaged with the female threaded portion of the base 2. The main body 3 is further provided in the interior thereof with a through hole extending in the direction of a longitudinal axis of the main body 3. The main body 3 is still further provided in the outer wall of the upper end thereof with two protruded portions 32 opposite in location to each other, and in the outer wall of the midsegment thereof with two sets of lugs 31.

The press rod 4 comprises a cap 41, a spring "S", and a leg block 42. The cap 41 is engaged is engaged with the top end of the rod body of the press rod. The spring "S" is fitted over the press rod 4. The leg block 42 is fastened with the bottom end of the rod body of the press rod 4 and is provided in the underside thereof with a toothed portion 421 engageable with the toothed portion 211 of the receiving space 21 of the base 2. The press rod 4 is received in the through hole of the interior of the main body 3.

The holding arms 6 are arcuate in construction and are fastened pivotally with the lugs 31 of the main body 3. The holding arms 6 are provided respectively at the bottom end thereof with a hooked body 61, and in the inner side wall thereof with a reinforcing rib 62. The hooked bodies 61 of the holding arms 6 are intended for use in holding the IC element 5, as illustrated in FIG. 4-A.

In operation, the holding arms 6 can be swiveled, as illustrated in FIG.3. As illustrated in FIGS. 4-A and 4-B, the IC hand tool of the present invention is held in the hand of an operator such that the thumb is located on the cap 41 of the press rod 4, and that other fingers of the hand grip the main body 3, with the index finger resting against the protruded portions 32 of the main body 3.

In the meantime, the IC element 5 is located in the receiving space 21 of the base 2. As the cap 41 of the press rod 4 is pressed by the thumb, the leg block 42 of the press rod 4 is caused to displace such that the toothed portion 421 of the leg block 42 is engaged with the toothed portion 211 of the receiving space 21 of the base 2.

Figure 5:
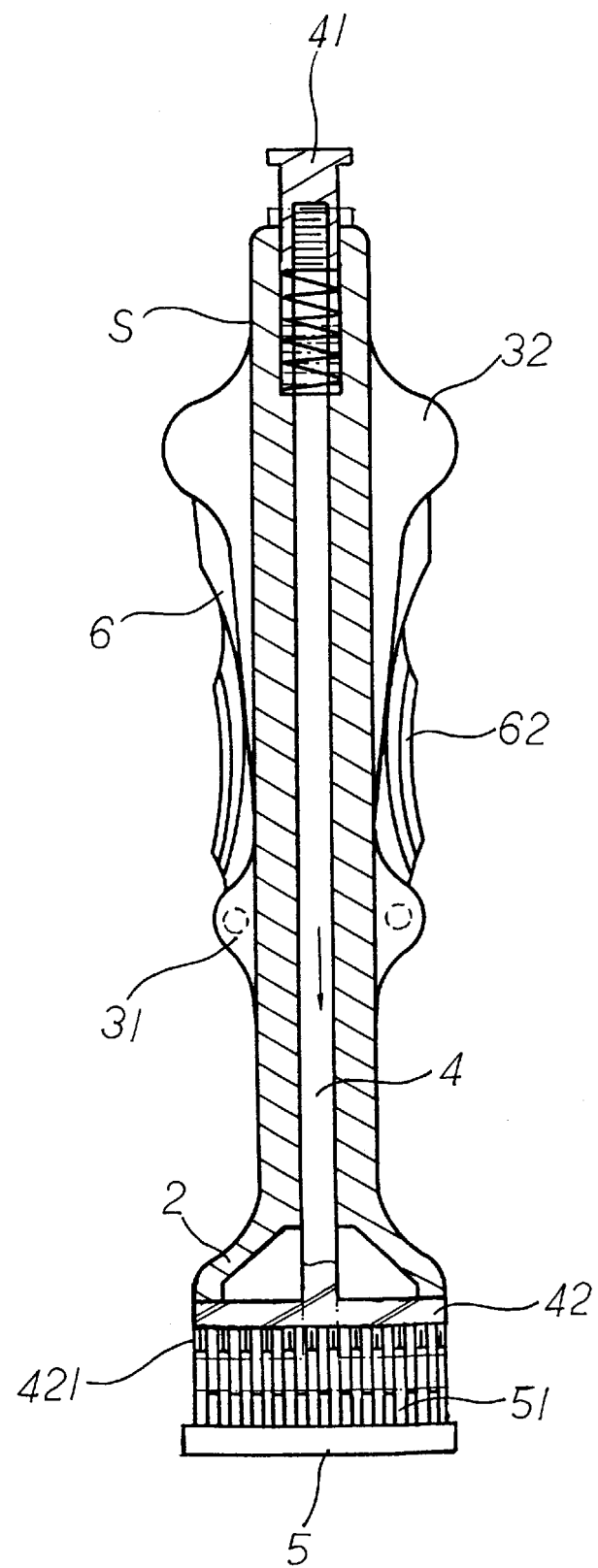
FIG. 5 shows a sectional schematic view of the present invention holding the fastening pins of the IC element.
Figure 6:
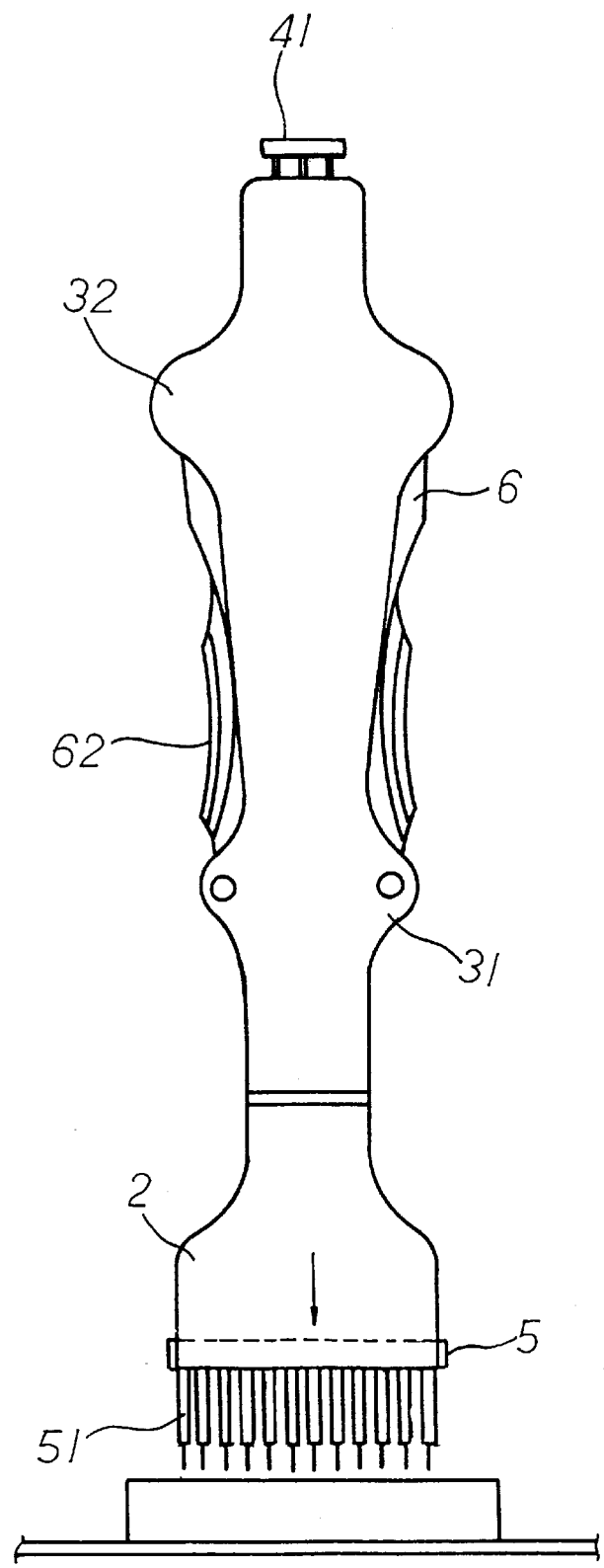
FIG. 6 shows a schematic view of the present invention guiding the IC element in an assembling process.
Figure 7:
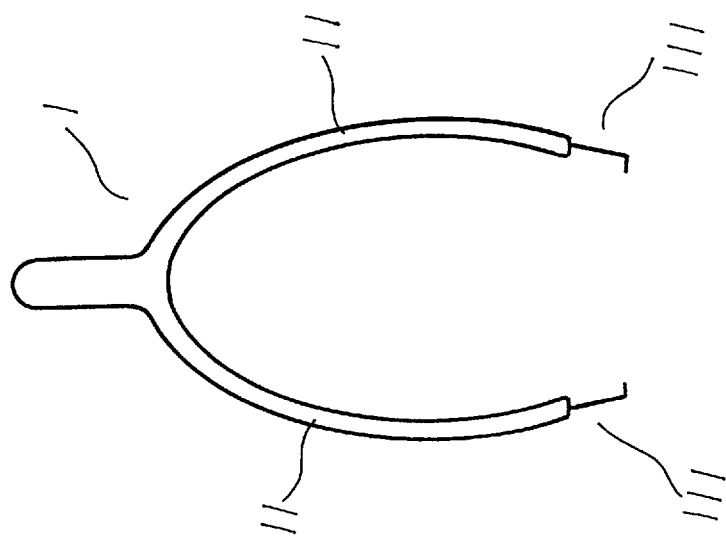
FIG. 7 shows a schematic view of a prior art hand tool for handling an electronic element.

As illustrated in FIGS. 5 and 6, the IC element 5 may be put into the receiving space 21 of the base 2 such that the insertion pins 51 of the IC element 5 face the receiving space 21. On the other hand, the IC element 5 may be put into the receiving space 21 of the base 2 such that the main body of the IC element 5 faces the receiving space 21.

The embodiment of the present invention described above is to be regarded in all respects as being merely illustrative and not restrictive. Accordingly, the present invention may be embodied other specific forms without deviating from the spirit thereof. For example, the holding arms 6 of the present invention may be provided respectively in the outer wall thereof with a skidproof, embossed surface to facilitate the gripping of the main body 3 by the hand of an operator. The present invention is therefore to be limited only by the scopes of the following appended claims.

What is claimed is:

1. A hand tool for handling an electronic element, said hand tool comprising:

a base provided at a bottom thereof with a receiving space having a toothed portion, said base further provided at a top thereof with a threaded portion, said receiving space being dimensioned to receive an electronic element;

a main body provided at a bottom end thereof with a threaded portion which is engaged with said threaded portion of said base, said main body further provided in an interior with a through hole extending in the direction of a longitudinal axis of said main body, said main body still further provided in outer wall of a top end thereof with two protruded portions opposite in location to each other, and in outer wall of a midsegment thereof with two sets of the lugs;

a press rod having a cap which is engaged with a top end of said press rod, said press rod further having a spring fitted thereover and a leg block fastened with a bottom end of said press rod, said leg block provided in an underside thereof with a toothed portion, said press rod being received in said through hole of said interior of said main body such that said cap of said press rod is located outside said top end of said main body and that said toothed portion of said leg block of the press rod is engageable with said toothed portion of said receiving space of said base; and two holding arms fastened pivotally with said lugs of said main body and provided respectively at one end thereof with a hooked body for holding the electronic element received in said receiving space of said base, said holding arms further provided respectively in an inner side wall thereof with a reinforcing rib.

2. The hand tool as defined in claim 1, wherein said holding arms are provided respectively in an outer side wall thereof with a skidproof embossed surface.

* * * * *